United States Patent [19]

Smith et al.

[11] Patent Number: 4,871,966
[45] Date of Patent: Oct. 3, 1989

[54] APPARATUS AND METHOD FOR MULTIPLE ANGLE OBLIQUE MAGNETIC RESONANCE IMAGING

[75] Inventors: Stanton D. Smith, Bellport; David Hertz, Dix Hills; Robert B. Wolf, Medford; Robert H. Olsen, Bethpage, all of

[73] Assignee: Fonar Corporation, Melville, N.Y.

[21] Appl. No.: 272,117

[22] Filed: Nov. 16, 1988

Related U.S. Application Data

[63] Continuation of Ser. No. 931,333, Nov. 14, 1986, abandoned.

[51] Int. Cl.⁴ .............................................. G01R 33/20
[52] U.S. Cl. ................................................... 324/309
[58] Field of Search ............... 324/307, 309, 312, 313, 324/314, 318

[56] References Cited

U.S. PATENT DOCUMENTS

| | | | |
|---|---|---|---|
| 4,472,683 | 9/1984 | Sekihara et al. | 324/309 |
| 4,656,423 | 4/1987 | Sugimoto | 324/309 |
| 4,673,880 | 6/1987 | Compton et al. | 324/309 |
| 4,710,716 | 12/1987 | Keren et al. | 324/309 |

OTHER PUBLICATIONS

Bottomley, P. A., "Instrumentation... NMR Imaging", Proceedings of International Symposium on Nuclear Magnetic Resonance Imaging, Bowman Gray School of Medicine, Oct. 1—3, 1981.

Primary Examiner—Stewart J. Levy
Assistant Examiner—Kevin D. O'Shea
Attorney, Agent, or Firm—Lerner, David, Littenberg, Krumholz & Mentlik

[57] ABSTRACT

An apparatus for obtaining, in the course of a single scan, NMR image data for a plurality of selected planes in an object, oriented at different angles, utilizes a slice pointer for outputting a signal indicating a particular plane to a multiplier and offset parameter RAM which provides multiplier and offset terms corresponding to the angle of the plane. A generator provides a generic gradient waveform to an arithmetic unit which combines this waveform with the multiplier and offset parameters from the RAM to create waveforms, which when applied to the gradient coils of an NMR apparatus, rotate the slice selector and the readout gradients, thereby permitting image data to be obtained in planes having different angles. A method in accordance with the apparatus of the present invention is also disclosed.

12 Claims, 9 Drawing Sheets

APPARATUS AND METHOD FOR MULTIPLE ANGLE OBLIQUE MAGNETIC RESONANCE IMAGING

This is a continuation, of application Ser. No. 931,333, filed 11/14/86, abandoned.

FIELD OF THE INVENTION

The present invention relates generally to magnetic resonance imaging and, more particularly, to a method and apparatus capable of obtaining, in a single scan, NMR image data from selected planes, in an object, disposed at various angles, having varying distances between each other, and having image centers shifted relative to each other.

BACKGROUND OF THE INVENTION

Conventional prior art magnetic resonance imaging apparatus and techniques entail oblique imaging which permits image data to be taken from a plane through an object which is at an angle to one of the three orthogonal axes. Also, the prior art in this domain entails multi-slice imaging which permits image data, in one scan, to be taken in a plurality of parallel planes, through the object, which are orthogonal to one of the three orthogonal axes, which are uniformly spaced one from the other, and whose image centers are all aligned.

Further, present magnetic resonance imaging apparatus entail a combination of the above methods in an oblique multi-slice technique which was disclosed by FONAR Corporation in a technical exhibit at a conference of the Radiological Society of North America in November, 1984. Referring to FIG. 1, the oblique multi-slice technique permits images of an object 11, in one scan, to be obtained in planes, such as 1–7 extending into the paper, which are disposed at an angle P relative to one of the three primary orthogonal axes, arbitrarily designated Y. However, the planes 1–7 within a given scan are parallel, and have a constant distance D therebetween. Further, the positioning of the center of the image corresponding to the plane 1 determines the center of the image corresponding to each of the planes 2–7. That is, when the center of the image corresponding to the plane 1 is selected to be at a point 12 on the object 11, the centers of the images of the planes 2–7 are necessarily therefore at, respectively, points 13–18. The selection of the center of the image corresponding to the plane 1 at the point 12 determines the centers of the images corresponding to the other planes 2–7.

Accordingly, in the prior art, to generate an image from a first plane disposed at a first angle relative to one of the orthogonal axis, and to generate an image from a second plane disposed at a second angle, two scans are required. A full scan including the first plane disposed at the first angle must be taken, and then a second full scan including the second plane disposed at the second angle must be taken. Similarly, if the distance between planes is desired to be varied, then once again several scans are required, each having one of the desired distances between planes. Further, if the centers of the images corresponding to two or more planes are not desired to be aligned as in the prior art, then a separate scan is required to center the image of a particular plane. For example, to center the image corresponding to the plane 6 at the point 19 on the object 11, a second scan would be required; since, in the first scan the center of the image corresponding to the plane 6 coincides with the point 17.

Accordingly, to obtain images from planes which are not parallel to each other, or which possess varying distances between one another, or which have misaligned image centers, requires additional scans and time that is wasted in capturing nonessential information.

Thus, there is a need for an apparatus and method which permit, in a single scan, magnetic resonance images to be obtained from planes disposed at different angles, having varying distances therebetween, and having shifted image centers.

SUMMARY OF THE INVENTION

The present invention entails a method and apparatus for obtaining in the course of a single scan NMR image data for a plurality of differently oriented selected planes in an object using nuclear magnetic resonance techniques. A method in accordance with the present invention comprises positioning an object in a static homogeneous magnetic field; and determining first and second selected planes in the object for which NMR image data is to be obtained. The first selected plane is located at a first position of the object and has a first orientation with respect to a predetermined direction, and the second selected plane is located at a second portion of the object and has a second orientation with respect to the predetermined position The first and second orientations being different from one another.

The object is subjected to a plurality of repetitions of a first repetition sequence composed of NMR excitation and magnetic gradient field pulses. Each of the repetitions of the first repetition sequence includes the steps of applying an excitation pulse and reading out of an NMR signal produced by the excitation pulse. The excitation pulse for the first repetition sequence is applied at a first predetermined frequency in the presence of a first predetermined slice selector magnetic field gradient having a gradient direction extending perpendicular to the first selected plane. The first predetermined frequency is chosen so that application of the excitation pulse at the first predetermined frequency only excites selected nuclei in the first selected plane. The plurality of repetitions of the first repetition sequence is carried out in a manner to encode spatial information into a first collection of the NMR signals which are representative of NMR image data for the first selected plane.

The object is subjected to a plurality of repetitions of second repetition sequence composed of NMR excitation and magnetic field gradient pulses. Each of the repetitions of the second repetition sequence includes the steps of applying an excitation pulse and reading out of an NMR signal produced by the excitation pulse. The excitation pulse for the second repetition sequence is applied at a second predetermined frequency in the presence of a second predetermined slice selector magnetic field gradient having a gradient direction extending perpendicular to the second selected plane. A second predetermined frequency is chosen so that the application of the excitation pulse at the second predetermined frequency only excites selected nuclei in the second selected plane. The second predetermined slice selector magnetic field gradient and the second predetermined frequency are different from the first predetermined slice selector magnetic field gradient and the first predetermined frequency, respectively. The plurality of repetitions of the second repetition sequence are carried out in a manner to encode spatial information into a second collection of NMR signals which are representative of NMR image data for the second selected plane.

The plurality of repetitions of the first and second repetition sequence are each carried out during the course of a single scan of the object and each are continued substantially throughout the single scan. The repetition time interval for repeating each of the first and second repetition sequences is substantially the same. The steps of applying an excitation pulse and reading out of an NMR signal for each repetition of the second repetition sequence are performed at a different time during the repetition time interval than each of the steps of applying an excitation pulse and reading out of an NMR signal for the first repetition sequence.

The present invention also entails a method for conducting an examination of an object along two different selected planes using nuclear magnetic resonance techniques. This method comprises positioning an object in an NMR imaging apparatus. The apparatus includes means for generating a magnetic field, means for exciting selected nuclei to generate NMR signals and for reading of such NMR signals to provide a collection of NMR signals from selected regions of an object placed in the NMR imaging apparatus, and means for applying gradient magnetic fields The apparatus further includes means for obtaining NMR imaging data from the collection of NMR signals and means for producing an image from the NMR imaging data. The method further comprises operating the NMR imaging apparatus to obtain an NMR scout image for a portion of the object of the examination. While the object remains positioned in the NMR imaging apparatus, the scout image is used to select a first plane and a second plane of the object for which NMR image data is to be obtained. The first plane and the second plane are each transverse to the scout plane, and the first plane has a first orientation relative to the scout plane, and the second plane has a second orientation relative to the scout plane. The first orientation is different from the second orientation.

A plurality of NMR sampling operations are conducted to obtain NMR imaging data from the first selected plane of the object The step of conducting the sampling operations for the first plane is commenced at a first time during the course of a single scan, and is continued substantially throughout the single scan so as to obtain NMR imaging data for the first selected plane of the object.

A plurality of NMR sampling operations are conducted to obtain NMR imaging data from the second selected plane of the object which is different from the first selected plane. The step of conducting the sampling operations for the second selected plane is commenced at a second time during the course of the single scan which is later than the first time, but prior to completion of the step of conducting the sampling operations for the first selected plane. The step of conducting the NMR sampling operations for the second selected plane is continued substantially through the single scan to obtain NMR imaging data for the second selected plane.

Each of the plurality of NMR sampling operations includes an NMR excitation operation and an NMR reading operation. The NMR excitation operations for each of the selected planes are carried out in a manner so as to excite selected nuclei in each of the selected planes, and the NMR reading operations for each of the selected planes are carried out in a manner to encode spatial information into the obtained NMR imaging data. Each of the NMR excitation and NMR reading operations is performed at a different time during the course of the single scan than each of the other excitation and reading operations.

An apparatus in accordance with the present invention for obtaining, in the course of a single scan, NMR image data for a plurality of selected planes, in an object, disposed at different angles, includes a generic gradient waveform generator, and a slice pointer for outputting signals representing, respectively, the selected planes. A level pointer outputs signals representing, respectively, the repetitions of a repetition sequence. A RAM, coupled to the waveform generator, and to the slice and level pointers, stores multiplier and offset parameters corresponding to the different angles of the selected planes An arithmetic unit, coupled to the waveform generator and the RAM, transforms generic gradient waveforms into waveforms that effect rotations of a slice selector and a read out gradient by the angles corresponding to the selected planes.

The present invention permits NMR image data to be acquired from planes at varying angles in a single scan. Unlike the prior art, one need not conduct an entire scan with a plurality of slices at one fixed angle, and only thereafter, in a second scan, alter the slices to a second desired angle. The slices in a given scan may vary in angle from one slice to the next in accordance with the needs of the occasion. Further, in a single scan, the distances between slices may vary, unlike the prior art; and, the center of the image corresponding to a slice may be shifted from one slice to the next.

BRIEF DESCRIPTION OF THE DRAWINGS

Identical numerals in different figures refer to identical elements.

DETAILED DESCRIPTION OF THE PREFERRED EMBODIMENTS

The present invention entails a method and apparatus for obtaining NMR image data from a plurality of selected planes in an object which are nonparallel, in the course of a single scan.

Figure 1:
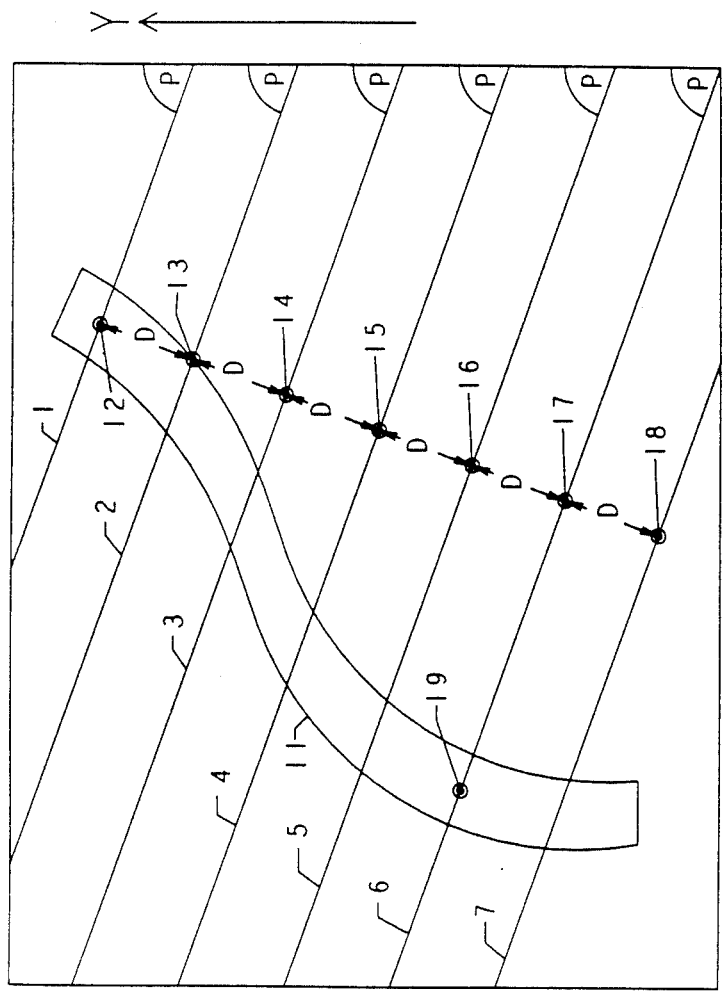
FIG. 1 is a schematic diagram utilized to explain the oblique multi-slice technique of the prior art.
Figure 2:
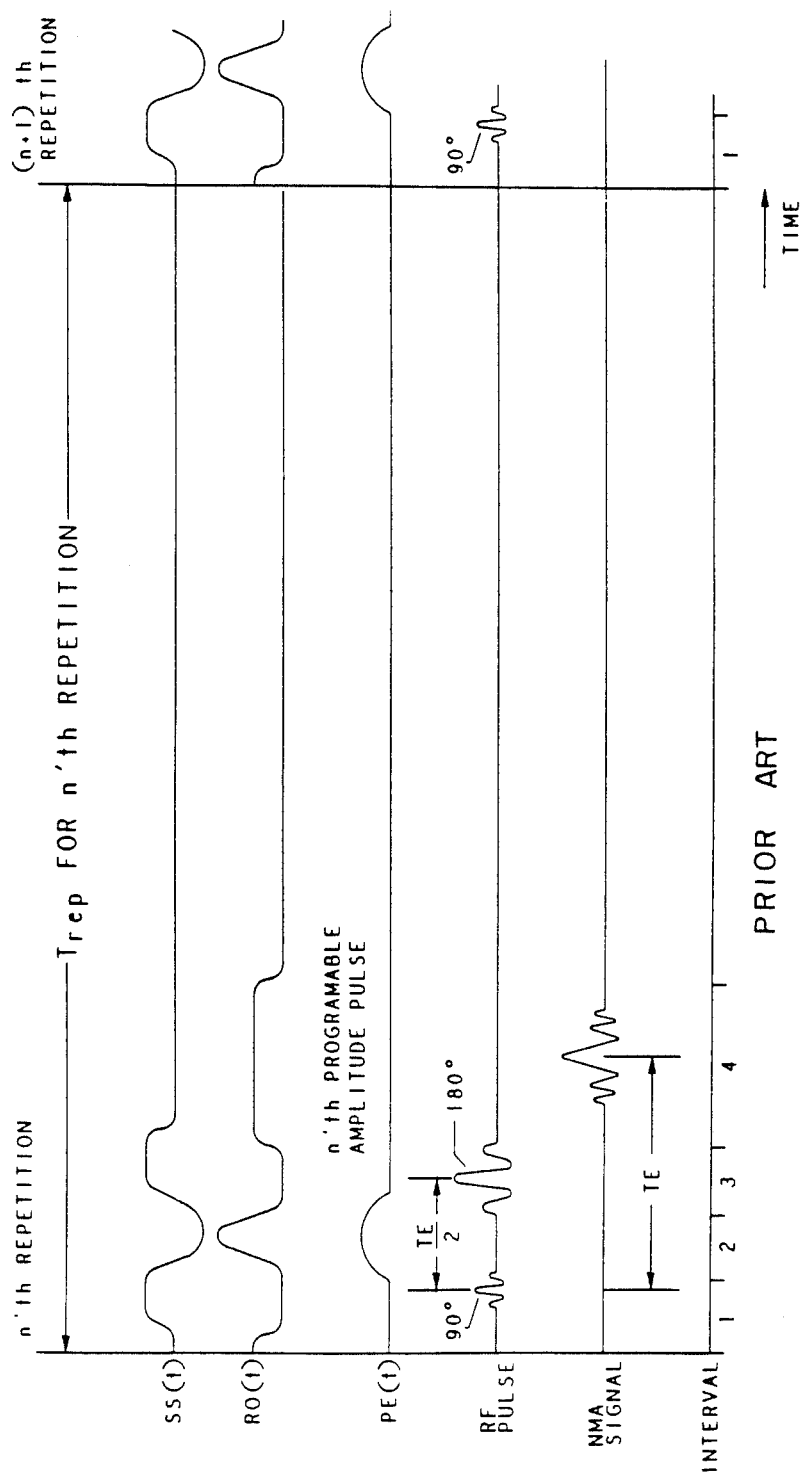
FIG. 2 is a schematic diagram of a repetition sequence entailing various waveforms applied in accordance with conventional NMR imaging techniques.

Referring to FIG. 2, in order to construct images of an object, present day NMR imaging apparatus generally utilize magnetic field gradients for selecting a particular slice or plane of the object to be imaged and for encoding spatial information in signals provided by the object. For instance, one conventional technique involves subjecting an object to a continuous static homogeneous field extending along a first direction and to sets of sequences of orthogonal magnetic field gradients which each generate a magnetic field component in the same direction as the static field but whose strengths vary along the direction of the gradients. In accordance with this known technique, nuclear spins in a selected plane are excited by a selective RF pulse in the presence of one of the magnetic field gradients, the frequency of the selective RF pulse corresponding to the Larmour frequency for only the selected plane of the object as determined by the magnetic field gradient imposed on the static magnetic field. Conveniently, the applied magnetic field gradient is designated the slice selector gradient. The selected plane will thus extend in a direction perpendicular to the gradient direction of the slice selector magnetic field gradient. This gradient is generated by applying a wave form designated SS(t) to a coil disposed along one of the three orthogonal axes. The excited selected spins are then subjected to the other magnetic field gradients, which can be designated the readout and phase-encoding magnetic field gradients, utilizing a plurality of repetitions in which the amplitude of the phase-encoding gradient is varied for each repetition and in which the readout gradient is applied during the reading out of the generated NMR signals The readout magnetic field gradient is generated by a wave form designated RO(t) applied to a coil disposed along a second of the three orthogonal axes. The phase-encoding magnetic field gradient is generated by applying a wave form designated PE(t) to a coil disposed along the third of the three orthogonal axes. The received NMR signals are then transformed utilizing conventional two-dimensional Fourier transform techniques. The readout magnetic field and phase-encoding magnetic field gradients serve to encode spatial information into the collection of NMR signals so that two-dimensional images of the NMR signals in the selected plane can be constructed. As will be appreciated, during the scanning sequence, the various magnetic field gradients are repeatedly switched on and off at the desired intervals. Such a two-dimensional Fourier transform imaging technique and the pulse sequence for such a technique is described in the book entitled *Nuclear Magnetic Resonance Imaging in Medicine*, published in 1981 by Igaku-Shoin, Ltd., Tokyo, and is sometimes known as spin-warp imaging.

Furthermore, many NMR imaging schemes today rely on the collection of spin-echo NMR signals rather than free induction decay (FID) signals FID NMR signals are achieved by application of a 90 degree RF excitation pulse and then reading out of the produced signal The present invention may be utilized with NMR imaging techniques which employ either spin-echo NMR signals, or free induction decay NMR signals.

Referring to FIG. 2, in utilizing the spin echo signals, a 90 degree RF excitation pulse is followed by the application of a 180 degree rephasing RF pulse at a predetermined time interval after the 90 degree pulse. This produces a spin-echo signal at a corresponding time interval after the application of the 180 degree RF pulse. In NMR parlance, the tie of the produced spin-echo NMR signal after the 90 degree RF excitation pulse is designated as TE (for time of echo). Thus the 180 degree RF pulse is applied at a time interval of TE divided by 2 after the 90 degree RF pulse.

The technique of multi-slice imaging has been developed for obtaining NMR images from a multiple number of parallel planes of the object by exciting the nuclei in the planes and reading out NMR signals therefrom during a single scan. More particularly, in multi-slice imaging, the slices or planes in the imaging volume are excited one after another during different portions of the interval between repetitions by packing an integral number of slice excitations between successive excitations in one particular plane or slice. For example, when selective RF pulses are applied in the presence of a magnetic field gradient, only a limited region of the objected is excited due to satisfaction of the resonance conditions. Accordingly, different frequencies will excite different parts of the object. As the repetition sequence for any particular slice involves an excitation followed by reading of the new signal and then followed by a recovery interval before applying the excitation pulse in a subsequent repetition, the nuclei in differing regions or planes can be excited during the recovery interval for one particular plane, thus efficiently utilizing the recovery time interval to selectively excite nuclei and read out NMR signals in other planes. Generally, the number of planes for which NMR images can be obtained is dependent on the recovery time interval between successive excitation pulses in a single plane and the sequence interval required for exciting and reading out of a NMR signal in one plane plus the time for switching of the gradients. For example, in connection with a spin-echo imaging sequence, the slice interval will correspond to the time necessary to apply a 90 degree excitation RF pulse, to apply a 180 degree rephasing RF pulse, to observe the echo produced thereby, and to raise and lower the appropriate gradients. During the portion of a repetition sequence following the sequence time interval, additional selected planes can be sequenced utilizing different frequencies in a consecutive manner.

Since the recovery time before reapplying an excitation pulse in connection with NMR images is generally long in comparison to the time needed to apply the excitation pulse, the rephasing RF pulse and the reading of the signals (together with the time needed to switch the appropriate gradients on and off), it is apparent that NMR signals can be generated and read out for a number of planes within the overall repetition time interval. For example, it is convenient to let TS represent a sequence time interval needed for a single slice to apply a 90° RF pulse, a 180° rephasing RF pulse, to read out the spin-echo signal and the time needed to raise and lower the appropriate gradients. A number of slices or planes for which imaging data can be obtained is thus equal to the largest integral number obtained from dividing the repetition time $T_{rep}$ by the sequence time interval TS.

Figure 9:
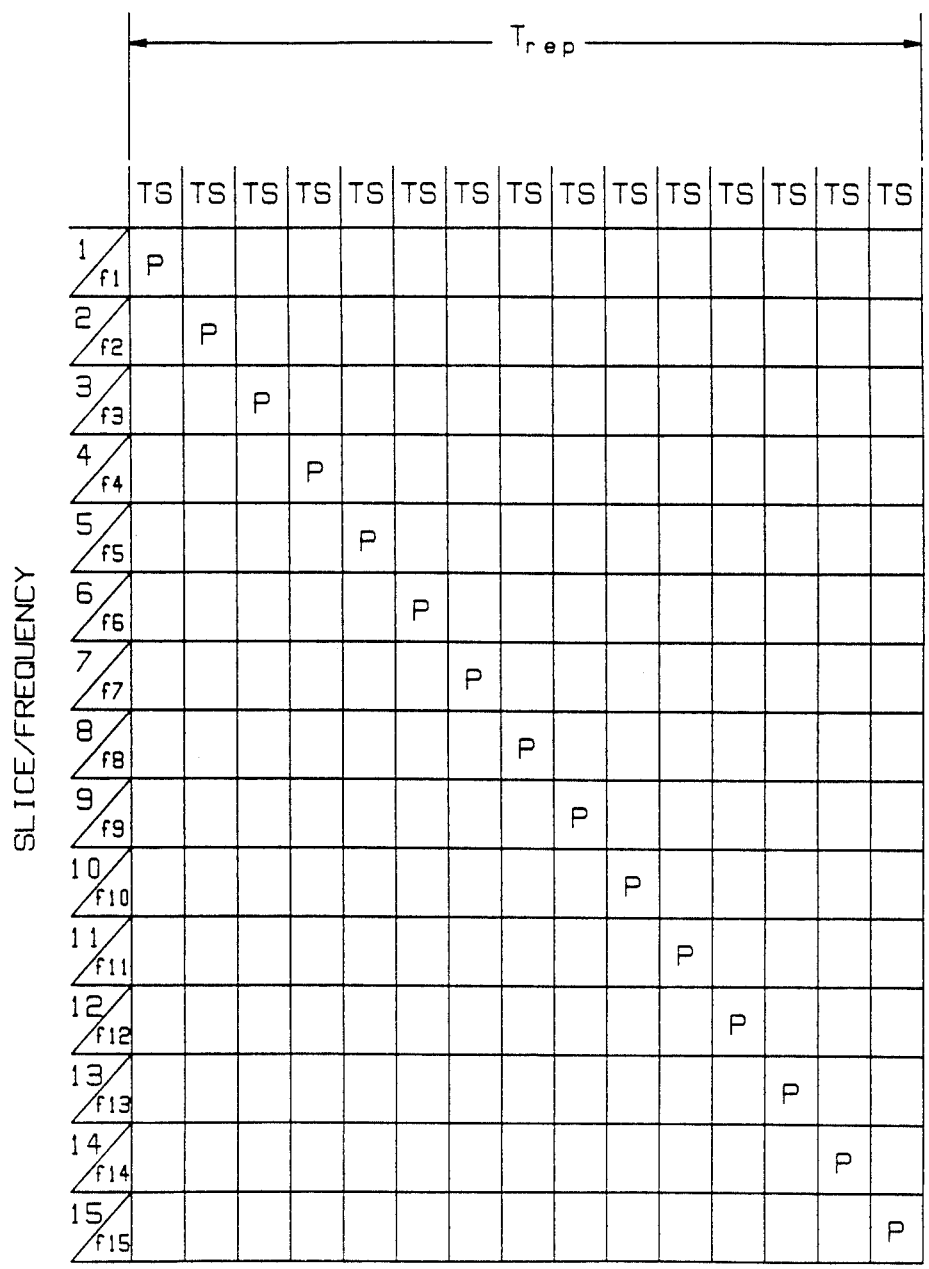
FIG. 9 is a schematic diagram depicting the timing of operations for fifteen slices during one repetition time interval of a multi-slice NMR imaging technique.

Referring to FIG. 9, there is shown a schematic diagram of the scheme for exciting selected nuclei in each of 15 planes, and for collecting the NMR imaging data from the corresponding plane in a multi-slice technique for one repetition interval, utilizing the repetition sequence discussed hereinabove with reference to FIG. 2. In FIG. 9, the overall repetition interval $T_{rep}$ (along the horizontal axis) has been divided into 15 equal time slice intervals, TS. The vertical axis represents a number of slices of planes for which imaging data is to be collected, and has been labeled 1-15 to represent 15 different planes. Thus, imaging data for the 15 different planes or slices of an object are obtained during each repetition. Also, since the number of planes correspond to the number of different frequencies for the RF pulses, the vertical axis in FIG. 9 has also been labeled with frequencies $f_1$-$f_{15}$. The term "P" is utilized to represent the operations for exciting selected nuclei and reading out of the generated NMR signal (together with the operations for switching on and off the appropriate gradient coils), corresponding to the intervals 1-4 depicted in FIG. 2.

In connection with the multi-slice imaging sequence, the P operation for each slice or plane within the overall repetition interval $T_{rep}$ occurs during a corresponding one of the 15 sequence time intervals, TS, with no two P operations occurring during the same interval TS.

Thus, in conventional multi-slice imaging, during a first sequence interval TS of the repetition sequence, a 90° RF excitation pulse, and a 180° rephasing pulse are applied at a first frequency $f_1$ and the produced spin-echo signal then read out. This NMR signal will be representative of an NMR signal for nuclei in the first plane. Thereafter, during the recovery interval for the excited nuclei in the first plane, another sequence of a 90° RF excitation pulse, a 180° rephasing pulse and the reading out of the spin-echo NMR signal, with appropriate switching of the gradients, is carried out during the second sequence interval TS. This latter signal is representative of NMR signals from nuclei in the second plane. Thereafter, subsequent sequences of excitation, rephasing and reading out of NMR signals are carried out for the other planes in subsequent sequence intervals TS, when the excited nuclei in the first two planes are relaxing during their respective recovery intervals.

Accordingly, in a multi-slice NMR imaging method, consecutive sets of pulses and reading out of signals, at different frequencies, can be accomplished in one repetition time interval $T_{rep}$. In particular, the various slices or planes in the object being imaged are excited one after another, and the appropriate sequence interval, with the overall repetition rate for one slice being utilized to pack an integral number of slice intervals between successive excitations of the same slice. Each of the RF excitation and rephasing pulses is applied at a different frequency so as to excite a different slice or plane of the object. A single frequency only repeats itself once for each plane during the repetition time interval $T_{rep}$.

Figure 3:
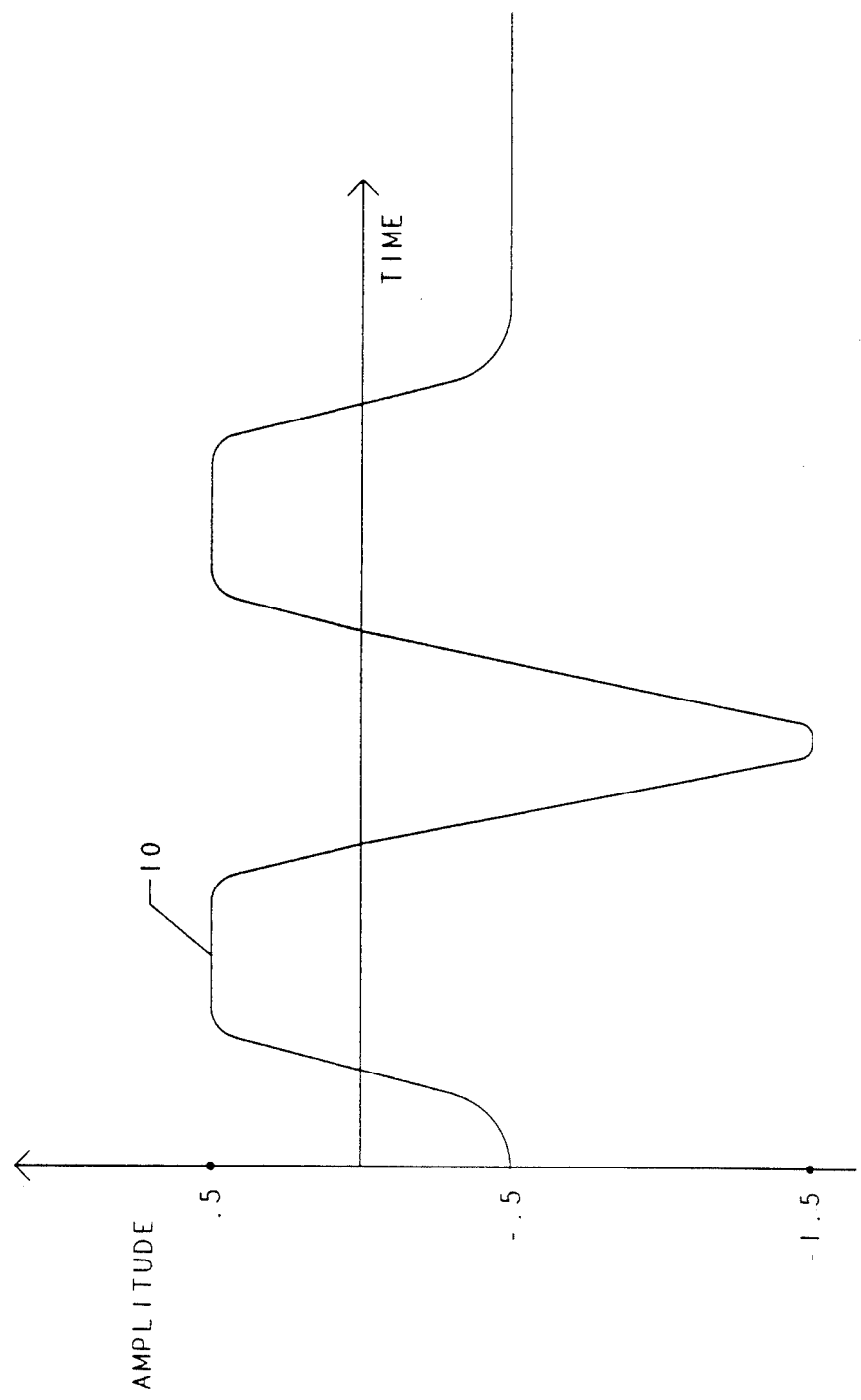
FIG. 3 is a schematic diagram of a generic gradient waveform utilized in a preferred embodiment of the present invention.

The slice selector magnetic field gradient is disposed along one of the three orthogonal axes, which may arbitrarily be designated as the Z axis. Similarly, the readout and the phase-encoding magnetic field gradients may arbitrarily be designated as disposed along the Y and X axes. Referring to FIG. 3, a generic wave form 10 is depicted from which the slice selector gradient wave form and the readout gradient wave form may be generated. The wave form 10 rises from an initial value of $-0.5$ to a maximum value of 0.5, after which it descends to its minimum of value of $-1.5$, thereafter rises once again to its maximum of 0.5, and then dips, finally, to once again $-0.5$. The ideal slice selector gradient wave form depicted in FIG. 2 is simply the wave form 10 shifted upwardly by 0.5. That is, the amplitude of the slice selector gradient wave form at any time is merely that of the wave form 10 plus 0.5. Accordingly, the ideal slice selector gradient wave form possesses two flat peaks of amplitude 1 with a valley therebetween dipping to $-1$ and for the remainder of the time is 0. Similarly, the readout gradient wave form is generated from the wave form 10 by taking the negative of the wave form 10 and adding 0.5 to it. That is, the amplitude of the ideal readout gradient wave form at any particular time is simply the negative of the value of the wave form 10 at that time to which 0.5 has been added. This produces an ideal readout gradient wave form which has an initial value of 1, dips to 0, rises to 2, dips again to 0, and rises again to 1. The phase-encoding magnetic field gradient wave form is distinct and not derivable from the generic wave form 10. Letting SS(t) represent the ideal slice selector gradient wave form, RO(t) represent the ideal readout gradient wave form, and G(t) represent the generic wave form 10, we have: $SS(t) = G(t) + 0.5$, and $RO(t) = -G(t) + 0.5$. However, in practice, owing to the characteristics of the particular NMR machine which is being utilized, an offset of other than exactly 0.5 may be required to generate, from the generic wave form 10, slice selector and readout wave forms which are nearly 0 in the required intervals. Thus, more generally $SS(t) = G(t) + A$, and $RO(t) = -G(t) + A$, where A is an offset term determined for the particular machine to which the waveforms will be applied.

Figure 4:
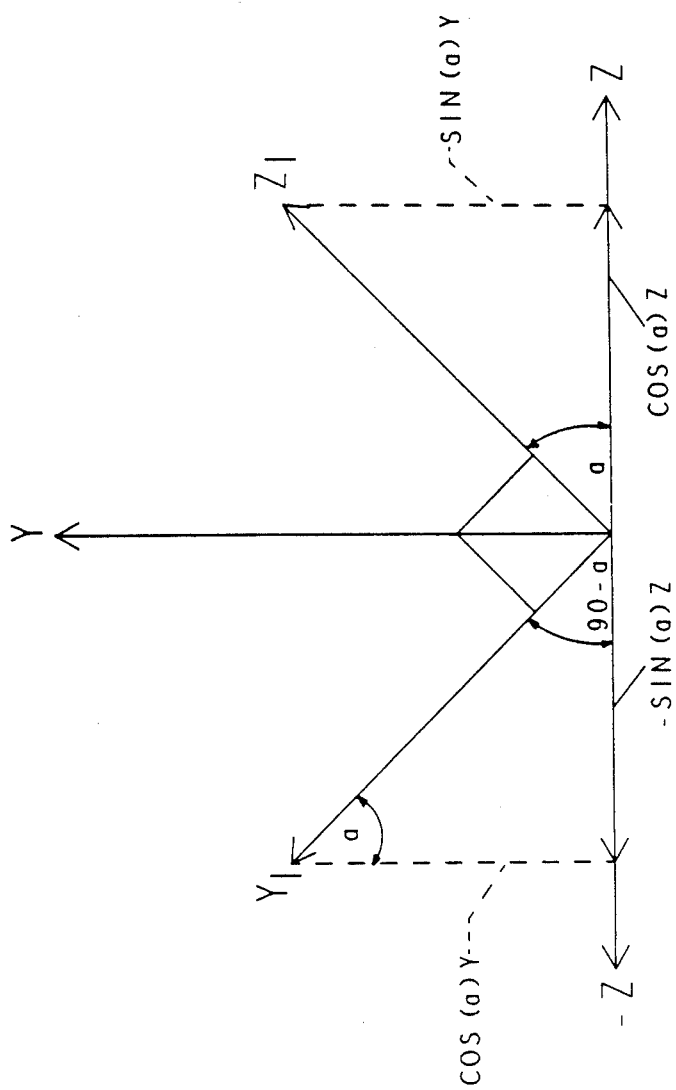
FIG. 4 is a diagram of orthogonal slice selector and readout gradients which are rotated by an angle "a" in accordance with the present invention.

Referring to FIG. 4, a rotation of both the Y and the Z axes by an angle "a" is depicted The rotated Z axis is designated $Z_1$, and the rotated Y axis is designated $Y_1$. Considering the various axes to be vectors, one has the following:

$$Z_1 = COS(a)Z + SIN(a)Y, \text{ and}$$

$$Y_1 = -SIN(a)Z + COS(a)Y$$

Thus, each of the rotated axes, considered as vectors, may be described as a linear combination of the Y and Z axes, considered as vectors. Each of the magnetic field gradients may be considered a vector pointing in the direction of the gradient. If the slice selector gradient in the Z direction is designated $Z_{SS}$, and a slice selector gradient in the Y direction is designated $Y_{SS}$, and if a slice selector gradient in the $Z_1$ direction is designated $Z_{1SS}$, then in accordance with the above equations, $Z_{1SS}$ is equal to $COS(a)Z_{SS} + SIN(a)Y_{SS}$. Similarly, if a readout gradient in the Z direction is designated $Z_{RO}$, if a readout gradient in the Y direction is designated $Y_{RO}$, and if a readout gradient in the $Y_1$ direction is designated $Y_{1RO}$, then in accordance with the above equations, $Y_{1RO}$ is equal to $-SIN(a)Z_{RO} + COS(a)Y_{RO}$. That is, the slice selector gradient in the $Z_1$ direction may be generated from a linear combination of the slice selector gradients in the Z and Y directions. Similarly, a readout gradient in the $Y_1$ direction may be generated from a linear combination of the readout gradients in the Z and Y directions.

Conventional NMR imaging apparatus comprise X, Y and Z coils for generating magnetic field gradients in, respectively, the X, Y and Z directions. To generate a slice selector gradient in the Z direction, the slice selector wave form, SS(t), is applied to the Z coil. Similarly, to generate a slice selector gradient in the Y direction, the slice selector wave form, SS(t), is applied to the Y coil. A readout gradient in the Z direction is created by applying the readout wave form, RO(t), to the Z coil, and a readout gradient in the Y direction is created by applying the readout wave form RO(t), to the Y coil. Thus, to generate a slice selector gradient in the $Z_1$ direction and a readout gradient in the $Y_1$ direction, a wave form COS(a)SS(t)−SIN(a)RO(t) is applied to the Z coil, and a wave form SIN(a)SS(t)+COS(a)RO(t) is applied to the Y coil. Replacing each of the expressions SS(t) and RO(t) by their equivalents in terms of G(t) and A, one has:

the wave form applied to the Z coil is
G(t)[COS(a)+SIN(a)]+A[COS(a)−SIN(a)], and the waveform applied to the Y coil is
G(t)[SIN(a)−COS(a)]+A[SIN(a)+COS(a)].

In practice, the slice selector waveform SS(t) is multiplied by a constant, denoted $C_{ss}$, such that the resulting waveform provides a predetermined slice selector gradient, denoted G gauss per inch. Similarly, in practice, the readout waveform is multiplied by a constant, denoted $C_{ro}$, such that the readout gradient possesses a predetermined value, which preferably is also G gauss per inch. Accordingly, to provide a slice selector gradient in the $Z_1$ direction, and a readout gradient in the $Y_1$ direction having predetermined values, the above waveform applied to the Z coil is multiplied by a constant, and the above waveform applied to the Y coil is multiplied by a constant. For gradients of G gauss per inch in both the $Z_1$ and $Y_1$ directions, the waveform applied to the Z coil is multiplied by $C_{ss}$, and the waveform applied to the Y coil is multiplied by $C_{ro}$. Thus, in the preferred embodiment, the waveform applied to the Z coil is [G(t)[COS(a)+SIN(a)]+A[(COS(a)−SIN(a)]]$C_{ss}$, and the waveform applied to the Y coil is [G(t)[SIN(a)−COS(a)]+A[SIN(a)+COS(a)]]$C_{ro}$.

Figures 5, 6:
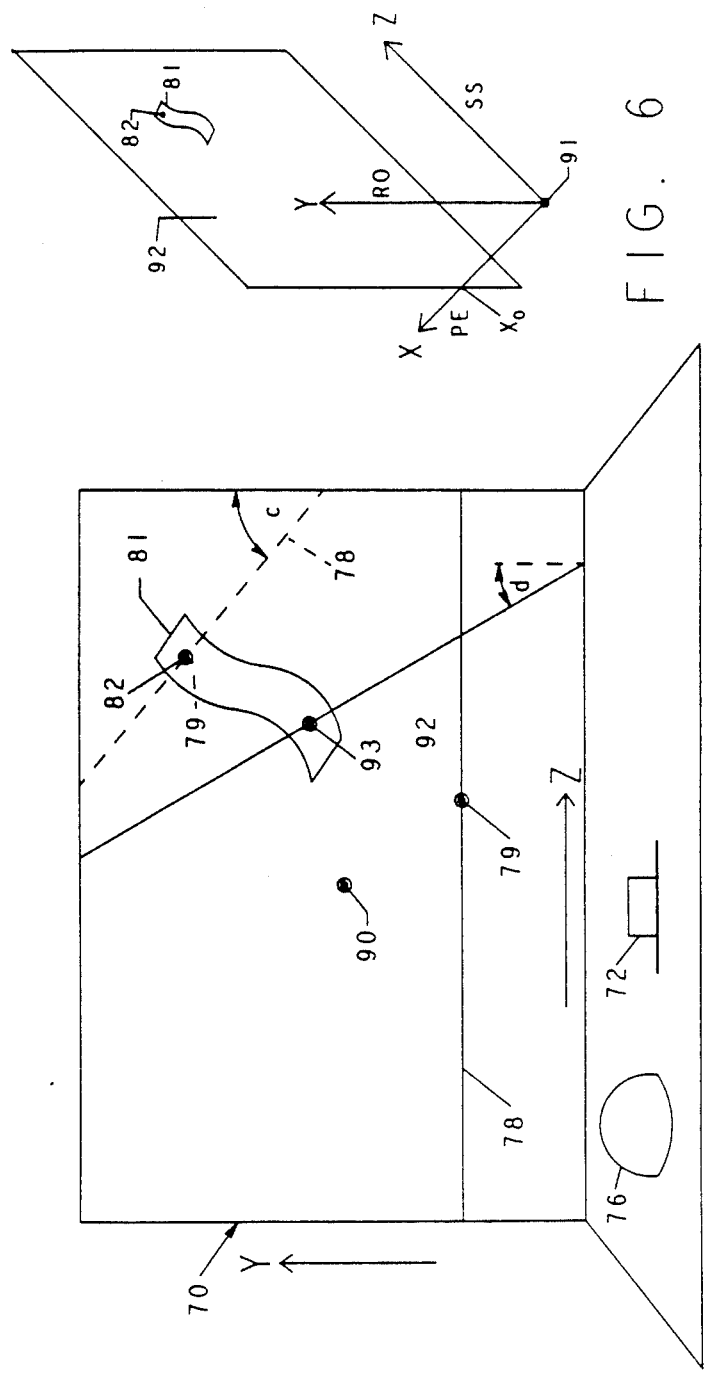
FIG. 5 is a schematic diagram of a display system and cursors thereon utilized with a preferred embodiment of the present invention.
FIG. 6 is a diagram representing orthogonal magnetic field gradients which extend from a reference point in an NMR magnet, and a plane corresponding to an image displayed on the CRT screen of FIG. 5.
Figure 7:
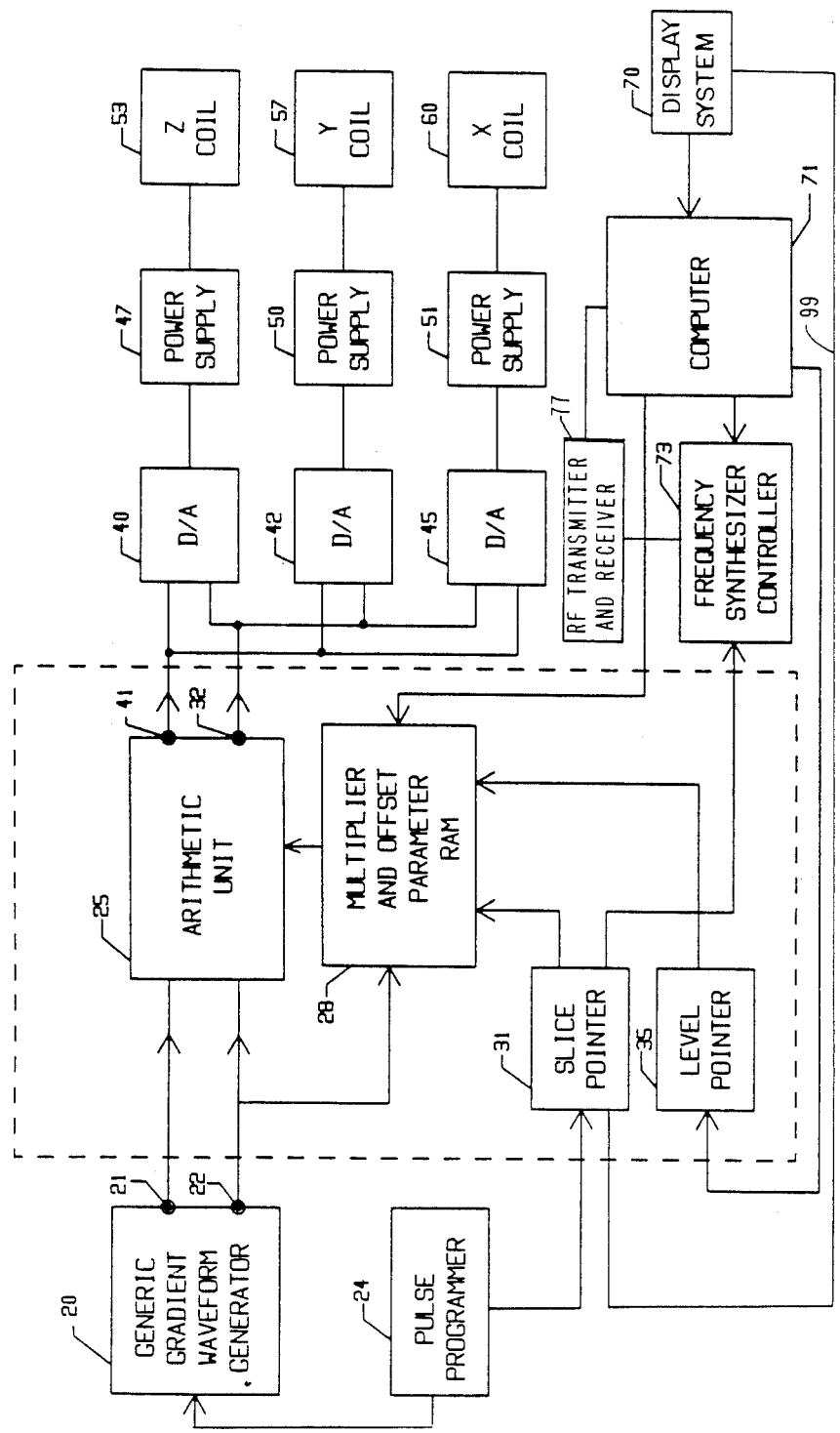
FIG. 7 is a block diagram of an apparatus in accordance with the present invention.

Referring to FIG. 5, a display system 70 utilized in conjunction with a preferred embodiment of the present invention is depicted. Referring also to FIG. 6, image data from an object in an NMR scanner taken in a plane 92 parallel to the YZ plane, and having a particular X coordinate, $X_o$, is displayed on the system 70. The image data in the plane 92 is obtained by initially applying a slice selector gradient along the X axis. Subsequently, the slice selector, the read out, and the phase encoding gradients are in, respectively, the Z, Y and X directions. A center 90 of the display system 70 corresponds to a center 91 of the NMR magnet. An object 81 appears in the plane 92 displayed on the system 70. A cursor 78 having a center 79 designated with a dot is positionable on the system 70 via controls 76 and 72. If image data from the object 81 is required in a plane orthogonal to the Y-Z plane at an angle "c" from the Y axis, then the cursor 78 is positioned such that the center dot 79 of the cursor 78 coincides with a desired point 82 on the object 81 and the cursor 78 is rotated to the desired angle "c" To position the cursor in this fashion requires moving the center dot 79 upwardly until it matches the Y coordinate of the object point 82 and then along the horizontal until the center dot 79 matches the Z coordinate of the object point 82, and then rotating the cursor 78 about the center 79 to the angle "c". The center of the image corresponding to the plane defined by the cursor 78 will coincide with the point 82 of the object 81. Referring also to FIG. 7, the display system 70 is coupled to a computer 71 to which is output the coordinate and angle information for the object point 82. That is, the computer 71 receives, from the system 70, the X coordinate, $X_o$, of the plane 92; the Y and Z coordinates of the object point 82 relative to the center 90 of the system 70, and the angle "c" of the desired plane, orthogonal to the Y-Z plane, passing through the object point 82. From these coordinates the location of the point 82 relative to the center 91 of the NMR magnet can be calculated. The slice selector, readout and phase encoding gradients have been calibrated such that the magnetic field strength changes in their respective directions in a predetermined amount per inch. Preferably, this change is uniform for each of the gradients and is G gauss per inch. Associated with a particular magnetic field strength is a particular RF frequency required to excite nuclei in a plane having that particular strength. Thus, the position of the point under consideration on the system 70 can be translated into corresponding frequencies associated with the gradient planes passing through the point. For example, if the point under consideration has a Z coordinate of 6 inches, then, if there is a slice selector gradient along the Z direction of G gauss per inch, a plane orthogonal to the Z axis at 6 inches passing through the point will have a magnetic field strength of 6G+$B_o$, where $B_o$ is the strength of the magnetic field at the origin. Thus, the frequency of the RF pulse required to excite nuclei in this plane perpendicular to the slice selector gradient at 6 inches, can be determined.

Figure 8:
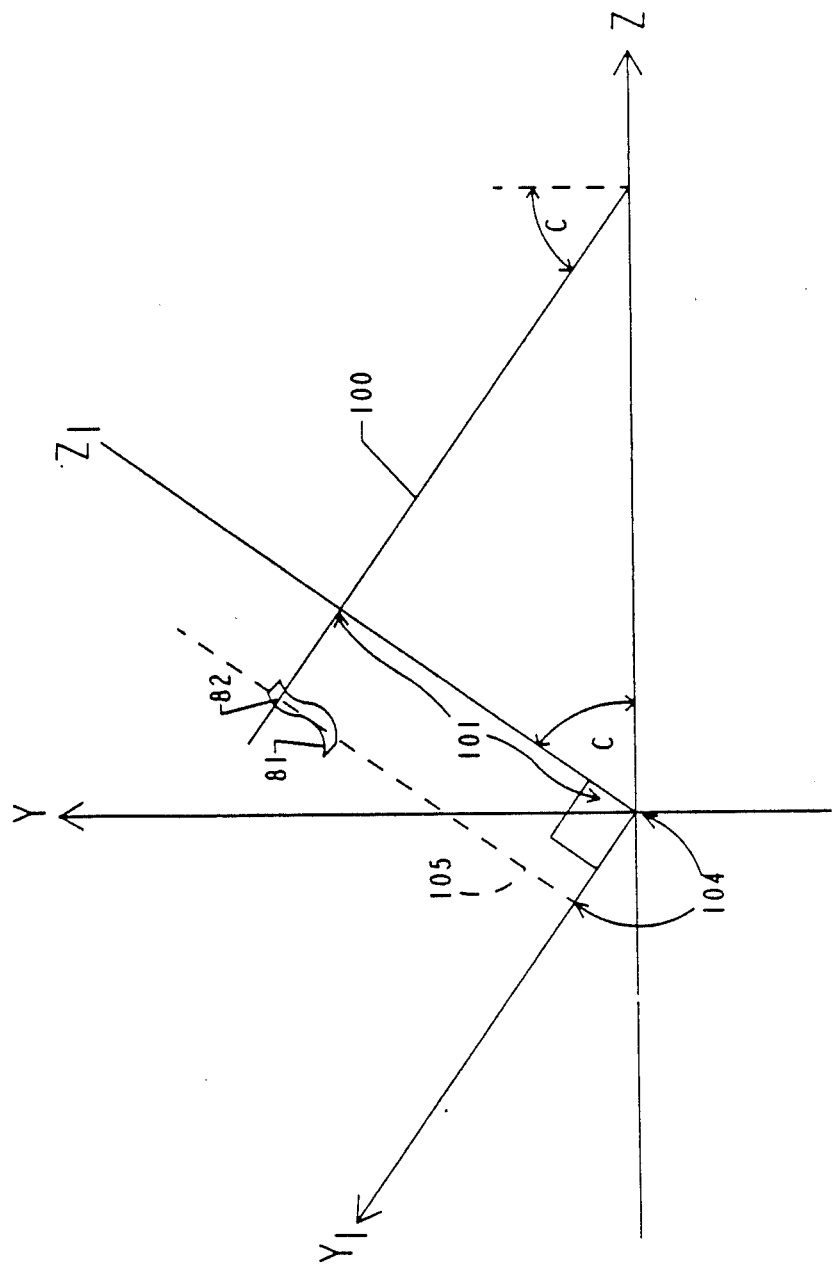
FIG. 8 is a diagram illustrating the determination of the magnetic field strength along a plane perpendicular to the direction of a rotated slice selector gradient, which passes through a selected portion of an object.

When the slice selector gradient has been rotated by an angle "c", the strength of the magnetic field in a plane perpendicular to the direction of the rotated slice selector gradient which passes through a particular object can be readily calculated based upon the angle "c". Referring to FIG. 8, a plane 100 extending into the paper through the object 81 is disposed at an angle "c" from the readout gradient direction Y. The plane 100 is perpendicular to the rotated slice selector gradient $Z_1$. That is, to generate a plane through the object 81 at the angle "c" having a constant magnetic field strength, the slice selector gradient Z is rotated by the angle "c" to form a rotated slice selector gradient $Z_1$. To determine the strength of the magnetic field in the plane 100, the length of a line 101, which extends from the origin perpendicularly to the plane 100, is calculated. Since the magnetic field changes by G gauss per inch, the change in the strength from the origin to the plane 100 may be calculated based upon the length of the line 101. To calculate the strength of the field in the plane 100 this calculated change is simply added to the strength of the field at the origin. In this fashion, one may derive the strength of the magnetic field in the plane perpendicular to the rotated slice selector axis, that passes through the object 81; and accordingly, infer the frequency of the RF pulse that will excite the nuclei in this plane. Similarly, the strength of the magnetic field in the plane 105 which is perpendicular to the rotated readout gradient $Y_1$ and which passes through the object 81 may be calculated from the length of the line 104, which is derivable from the angle of rotation "c". Thus, referring to FIGS. 5 and 7, the coordinate and angle data output by the display system 70 permit the computer 71 to calculate the strength of the magnetic field in the planes perpendicular to the rotated slice selector gradient, and the rotated readout gradient, which pass through the object under consideration. From the strength of the magnetic field in the plane perpendicular to the rotated slice selector gradient, the frequency of the RF pulse required to excite the nuclei in that plane may be derived. Further, from the data output by the system 70, the computer 71 can calculate the frequency required to demodulate the NMR signal during the read out period. Accordingly, the data from the system 70 provides all the necessary information for spatially encoding NMR signals output by the object corresponding to rotated slice selector and readout gradients.

The computer 71 performs all the necessary calculations for transforming the data output by the system 70 into corresponding coordinates and frequencies required for the imaging process.

Referring to FIG. 7, the display system 70 of FIG. 5 is coupled to the computer 71 to provide information regarding the angle "c" of the position cursor 78. To take another slice of the object 81 at a different angle, a second cursor 92 having a center dot 93 is selectively positioned through a second portion of the object 81 at a required angle "d". Additional cursors may be utilized to take additional slices through selected portions of the object 81 at desired angles, which may be the same or different, as required. In one scan, slices may be taken through the same portion of the object 81 at different angles, through different portions at the same angle, through different portions at different angles, or any combination of the above. That is, in a single scan, slices may be taken through any desired portions of the object at any desired angles. As noted above, the position of the portion of the object through which a slice is taken is determined by the movement of a cursor such that its center coincides with the portion of the object 81 through which the slice is taken. The center of the image corresponding to the slice will be the portion of the object 8I which coincides with the center of the cursor. This information in conjunction with the X coordinate of the plane being viewed on the system 70 is sufficient to determine the strength of the magnetic field in the planes which pass through the object and are perpendicular to the rotated slice selector and readout gradients, and the phase encoding gradient Thus, the coordinate and angle data afforded by the system 70 regarding the portion of the object 81 through which a slice is taken provides all the necessary parameters for the corresponding NMR imaging process. The computer 71 calculates all the necessary transformations from the data provided by the system 70 to the coordinates and corresponding frequencies of the NMR apparatus. In this fashion, utilizing a plurality of cursors on the system 70, any number of slices of corresponding portions of the object 81 may be taken at various angles within one scan. One simply positions the cursors in sequence at various selected portions of the object 81 at corresponding desired angles Preferably, the cursors do not cross within the region of interest; since, image information may be impaired in the intersecting region.

Referring to FIG. 7, the expression for the waveform applied to the Z coil above, when expanded, contains a constant coefficient of the generic waveform G(t), and a constant term. The coefficient of G(t) is designated a multiplier and equals $[COS(a)+SIN(a)]C_{ss}$. The constant term is designated an offset and equals $A[COS(a)-SIN(a)]C_{ss}$. Similarly, the waveform applied to the Y coil contains a multiplier term, which is the coefficient of the generic waveform G(t), and contains a constant term, designated an offset. The multiplier for the Y coil waveform equals $[SIN(a)-COS(a)]C_{ro}$, and the offset term equals $A[SIN(a)+COS(a)]C_{ro}$. These multiplier and offset terms for the Z coil and Y coil waveforms are calculated by the computer 71 for each slice from the angle information of that slice output by the system 70. For example, for the slice corresponding to the position of the cursor 92 in FIG. 5, the system 70 outputs a signal to the computer 71 indicating the angle "d" of the slice. In response, utilizing the angle "d", the computer 71 calculates the multiplier and offset terms for the waveform applied to the Z coil, and calculates the multiplier and offset terms for the waveform applied to the Y coil. These values, associated with this slice, are output by the computer 71 to a RAM 28 where they are stored. This is done, in sequence, for each of the slices taken through the object 81 via the corresponding cursors on the system 70.

Further, in response to the coordinate and angle data associated with each slice output by the system 70, the computer 71 calculates for each slice an RF excitation frequency for the plane orthogonal to the direction of the slice selector gradient rotated by the angle of the slice, which passes through the selected portion of the object, and a frequency required to demodulate the corresponding NMR signal during the read out period. These two frequencies are output by the computer 71 to a frequency synthesizer controller 73 where they are stored in sequence. Conventional radio frequency or "RF" transmitting and receiving apparatus 77 of the type commonly used in NMR apparatus is connected to frequency synthesizer controller 73 and to computer 71. The RF transmitting and receiving apparatus 77 uses the excitation an demodulation frequencies supplied by frequency synthesizer controller 73. RF transmitting and receiving apparatus applies RF excitation pulses to the object 81 and receives and demodulates the corresponding NMR signals. In the conventional manner, the RF transmitting and receiving apparatus passes the information from the demodulated NMR signals to computer 71 for production of images.

Referring to FIG. 7, a preferred embodiment of the apparatus of the present invention is depicted A generic gradient waveform generator 20 contains the generic waveform G(t) stored in digital form. The generator 20 also stores the phase encoding waveform, as illustrated in FIG. 2, in digital form. Preferably, the generator 20 stores these particular waveforms; but, may store others that suffice for purposes of the present invention. A pulse programmer 24 controls the waveform generator 20, and a slice pointer 31. The computer 71 controls a level pointer 35. In response to a pulse from the programmer 24, the generator 20 outputs, from a terminal 21, a word of stored waveform data corresponding to a particular axis. Simultaneously, a signal is output from a terminal 22 representing the axis corresponding to the output waveform data. For the X axis, a word of the digitally stored phase encoding waveform is output; for the Y axis, a word of the digitally stored generic waveform G(t) is output, and for the Z axis, a word of the digitally stored generic waveform G(t) is also output. In the sequence of outputs from the terminal 22, the order of the axes is predetermined, but not necessarily cyclical That is, the outputs of the terminal 22 are not necessarily X, Y, Z, X, Y, Z, etc. or some fixed permutation thereof; each axis need not appear every three outputs. The exact order of the axes is predetermined; but, may be adapted to the needs of the particular situation. The two outputs of the generator 20 are fed to an arithmetic unit 25. The output of the terminal 22 of the generator 20 is conveyed to the multiplier and offset parameter RAM 28. The slice pointer 31, in response to a pulse from the pulse programmer 24, outputs a signal to the RAM 28 and to the frequency synthesizer controller 73 indicating which of the slices, in the sequence of slices of the object 81, is to be taken. The level pointer 35 indicates which of the repetitions of the repetition sequence is to transpire, and conveys this information to the RAM 28 which also stores amplitude values for each of the repetitions. An output terminal 41 of the arithmetic unit 25 is coupled to digital-to-analog converters 40, 42, and 45. An output terminal 32 of the arithmetic unit 25 is also coupled to each of the digital-to-analog converters 40, 42, and 45. The terminal 41 provides waveform data for a particular axis, and the terminal 42 indicates the axis corresponding to that data. The digital-to-analog converters 40, 42, and 45 are coupled to, respectively, power supplies 47, 50 and 51, which are coupled, respectively, to an X coil 53, a Y coil 57, and Z coil 60, in the NMR apparatus.

In operation, the generic gradient waveform generator 20, in response to a pulse from the programmer 24, outputs from the terminal 21, a word of waveform data corresponding to a particular axis A signal indicating this particular axis, say the Z axis, is provided from the terminal 22. The waveform data and the axis signal are conveyed to the arithmetic unit 25, and the axis signal is conveyed to the multiplier and offset parameter RAM 28. The slice pointer 31 provides a signal to the RAM 28 indicating the particular slice from the sequence of slices on the system 70 from which images are to be generated. Slice pointer 31 is connected to display system 70 as schematically indicated at 99 in FIG. 7. In response to the axis indicating signal from the generator 20, and the slice indicating signal from the slice pointer 31, the RAM 28 outputs the above-described multiplier and offset terms for the corresponding axis and slice. Specifically, for an input from the slice pointer 31 indicating the second slice, and an input from the generator 20 indicating the Z axis, the RAM 28 outputs the multiplier $[COS(d) + SIN(d)]C_{ss}$, and outputs the offset $A[-COS(d) - SIN(d)]C_{ss}$. The arithmetic unit 25 multiplies the digital data representing the generic waveform $G(t)$ by the multiplier term and to this expression adds the offset term. The sum, which represents the waveform segment to be applied to the Z coil, is output in digital form from the terminal 41, and a signal indicating the corresponding Z axis is output from the terminal 32. The digital-to-analog converter 40 corresponding to the Z coil is accessed by the axis indicating signal output by the terminal 32, and the digital data output by the terminal 41 is directed to the converter 40 where it is converted to analog. The output of the converter 40 is applied to the Z coil 53 after being increased in amplitude by the power supply 47 For the same output of the slice pointer 31, a similar operation is performed with respect to the Y axis to provide the corresponding waveform segment to the Y coil. For the X axis, along which a phase encoding gradient is produced, the arithmetic unit 25 serves only to multiply the digital data representing the generic phase encoding waveform by a constant output by the RAM 28 in response to the repetition indicated by the level pointer 35. The resulting quantity is output from the terminal 41 of the arithmetic unit 25 to the X coil.

In this fashion, the Z coil, the Y coil, and the X coil, receive corresponding waveforms in a predetermined sequence. As indicated above, the waveforms applied to the Z coil and the Y coil serve to rotate the slice selector and the read out gradients in, respectively, the Z and Y axes by the angle corresponding to the slice indicated by the slice pointer 31. With the slice selector and read out gradient directions rotated in this fashion, the conventional NMR technique for eliciting signals representing image data is applied.

The process for generating images from the various rotated planes through the corresponding portions of the object 81 is similar to the conventional multi-slice technique, except that the waveforms are no longer necessarily the conventional ones indicated in FIG. 2; but, the waveforms applied to the Z coil and Y coil are functions of the angle of the slice which is being taken. As with the conventional multi-slice imaging technique, the slices or planes taken in accordance with the present invention are excited one after another during different portions of an interval between repetitions by packing an integral number of slice excitations between successive excitations in one particular plane or slice. That is, when selective RF pulses are applied in the presence of a magnetic field gradient, only a limited region of the object is excited due to satisfaction of the resonance conditions. Accordingly, different frequencies will excite different parts of the object. As the repetition sequence for any particular slice involves excitation followed by reading of the produced signal and then followed by a recovery interval before applying the excitation pulse in a subsequent repetition, the nuclei in different regions or planes can be excited during the recovery interval for one particular plane, thus efficiently utilizing the recovery time interval to selectively excite nuclei and read out NMR signals in other planes. Generally, the number of planes for which NMR images can be obtained is dependent upon the recovery time interval between successive excitation pulses in a single plane and the sequence interval required for exciting and reading out of an NMR signal in one plane plus the time for switching of the gradients.

Thus, the above-described apparatus of a preferred embodiment of the present invention calculates the slice selector, read out and phase encodings waveforms in real time, just before application to the corresponding magnet coils, and excitation of the corresponding slice. In this fashion, relatively little memory is required for storage purposes; most quantities are merely calculated, as needed, then output.

The present invention permits a plurality of slices of an object to be taken at varying angles within the same scan. Accordingly, there is no longer the need to position all of the slices in a multi-slice scan at the same angle, and to therefore require a second scan for any second required angle of a slice.

Figure 10:
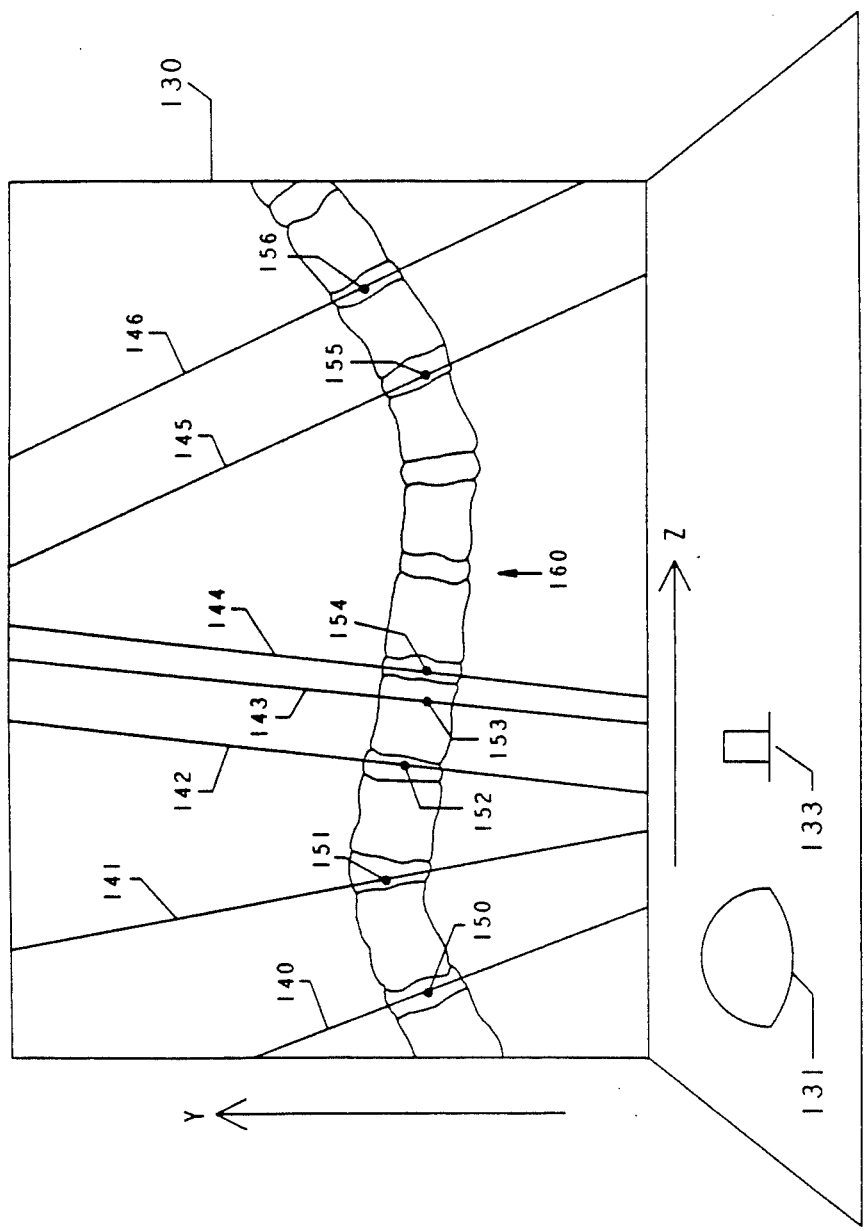
FIG. 10 is a schematic diagram illustrating a medical application of a preferred embodiment of the present invention.

Referring to FIG. 10, a particular medical use of the apparatus of the present invention is depicted. A patient is disposed in an NMR imaging apparatus, and a scout scan is taken of the patient's spine, which is displayed on a screen 130. While the patient is lying in the NMR apparatus, an operator positions, via controls 131 and 133, cursors 140-146 having, respectively, centers 150-156 to provide image data from corresponding planes through the spine 160. In this fashion, image data may be generated from planes whose angles correspond to the dispositions of the various vertebrae of the spine 16o. In accordance with the present invention, it is no longer necessary to subject the patient to repeated scans corresponding to the angles required to properly provide image data from vertebrae having different orientations. The operator may select slices of the spine 160 at any required angles within one single scan. Further, the distances between the required planes need not be uniform, and the centers of the images corresponding to the cursors 140–146 need not be aligned. That is, the centers of the images corresponding to the cursors 140–146 will coincide with, respectively, the center dots 150–156, despite the fact that the center dots 150–156 are not aligned.

While the above-described embodiment of the present invention utilized image data on the system 70 from a plane having a particular X coordinate, this is not necessary. The present invention may be utilized to take image data from various planes disposed at corresponding angles with respect to any one particular axis. For example, referring again to FIG. 5, the image on the system 70 may be a conventional television image of the object taken from outside the object, and the cursors positioned with respect to this image. Further, although the embodiment described above utilized slice selector and readout gradients that were rotations of reference slice selector and readout gradients that were fixed from slice-to-slice, this is not necessary for the present invention. That is, a first slice may correspond to slice selector and readout gradients that are rotations of a slice selector gradient along the Z axis and a readout gradient along the Y axis; but, a second slice may correspond to a rotation of a slice selector gradient disposed along the X axis and the readout gradient disposed along the Z axis. For each slice, in accordance with the present invention, the reference readout and slice selector gradients may be permuted among the three orthogonal axes.

For purposes of the present invention, all that is required are the X, Y and Z coordinates of the point through which a plane is desired, and the angle of the plane relative to an arbitrarily chosen read out gradient direction, or equivalently the angle which the plane is rotated about an arbitrarily chosen phase encoding gradient direction. The system 70 of FIG. 7 provides this information; but, any source of this data, including direct input, suffices for the purposes of the present invention. As mentioned above, the slice selector, read out and phase encoding gradient directions may be permuted among the orthogonal coordinates from slice to slice.

The present invention may be employed with the spin-echo NMR technique, the free induction decay (FID) technique, or with any NMR technique utilizing a slice-selector gradient.

The present invention also entails methods corresponding to the operations described above.

While the invention has been described in its preferred embodiments, it is to be understood that the words which have been used are words of description rather than limitation, and that changes within the purview of the appended claims may be made without departing from the true scope and spirit of of the invention in its broader aspects.

What is claimed is:

1. A method for obtaining in the course of a single scan NMR image data for a plurality of differently oriented selected planes in an object using nuclear magnetic resonance techniques, said method comprising the steps of:

(a) positioning an object in a static homogeneous magnetic field;
 (b) determining first and second selected planes in said object for which NMR image data is to be obtained, said first selected plane being located at a first portion of said object and having a first orientation with respect to a predetermined direction and said second selected plane being located at a second portion of said object and having a second orientation with respect to said predetermined direction, said first and second orientations being different from one another;
 (c) subjecting said object to a plurality of repetitions of a first repetition sequence composed of NMR excitation and magnetic gradient field pulses, each of said repetitions of said first repetition sequence including the steps of applying an excitation pulse and reading out of an NMR signal produced by said excitation pulse, said excitation pulse for said first repetition sequence being applied at a first predetermined frequency in the presence of a first predetermined slice selector magnetic field gradient having a gradient direction extending perpendicular to said first selected plane, said first predetermined frequency being chosen so that said application of said excitation pulse at said first predetermined frequency only excites selected nuclei in said first selected plane, and said plurality of repetitions of said first repetition sequence being carried out in a manner to encode spatial information into a first collection of said NMR signals, said first collection of NMR signals being representative of NMR image data for said first selected plane; and
 (d) subjecting said object to a plurality of repetitions of a second repetition sequence composed of NMR excitation and magnetic field gradient pulses, each of said repetitions of said second repetition sequence including the steps of applying an excitation pulse and reading out of an NMR signal produced, by said excitation pulse, said excitation pulse for said second repetition sequence being applied at a second predetermined frequency in the presence of a second predetermined slice selector magnetic field gradient having a gradient direction extending perpendicular to said second selected plane, said second predetermined frequency being chosen so that said application of said excitation pulse at said second predetermined frequency only excites selected nuclei in said second selected plane, said second predetermined slice selector magnetic field gradient and said second predetermined frequency being different from said first predetermined slice selector magnetic field gradient and said first predetermined frequency, respectively, and said plurality of repetitions of said second repetition sequence being carried out in a manner to encode spatial information into a second collection of NMR signals, said second collection of NMR signals being representative of NMR image data for said second selected plane;
 said plurality of repetitions of said first and second repetition sequences each being carried out during the course of a single scan of said object and each being continued substantially throughout said single scan, the repetition time interval for repeating each of said first and second repetition sequences being substantially the same and said steps of applying an excitation pulse and reading out of an NMR signal for each repetition of said second repetition sequence being performed at a different time during said repetition time interval than each of said steps of applying an excitation pulse and reading out of an NMR signal for said first repetition sequence.

2. The method of claim 1, wherein step (c) comprises generating said magnetic gradient field pulses of said first repetition sequence via a first and a second waveform, corresponding to said first orientation of said first selected plane, which produce said first predetermined slice selector magnetic field gradient, and a first predetermined read out magnetic field gradient having a direction orthogonal to that of said first predetermined slice selector magnetic field gradient; and wherein step (d) comprises generating said magnetic field gradient pulses of said second repetition sequence via a third and a fourth waveform, corresponding to said second orientation of said second plane, which produce said second predetermined slice selector magnetic field gradient, and a second predetermined read out magnetic field gradient having a direction orthogonal to that of said second predetermined slice selector magnetic field gradient.

3. The method of claim 2 using an NMR imaging apparatus having first means for generating a first magnetic field gradient having a first direction, and second means for generating a second magnetic field gradient having a direction orthogonal to said first direction, a direction of said first predetermined slice selector gradient being said first direction rotated by a first angle a, and a direction of said second predetermined slice selector gradient being said first direction rotated by a second angle b, wherein the step of generating said magnetic gradient field pulses of said first repetition sequence comprises applying said first waveform to said first means, said first waveform being of a form $[G(t)[COS(a)+SIN(a)]+A[(COS(a)-SIN(a)]]C_{ss}$, where $G(t)$ is a predetermined gradient waveform, and A, and $C_{ss}$ are predetermined constants; and applying said second waveform to said second means, said second waveform being of a form $[G(t)[SIN(a)-COS(a)]+A[SIN(a)+COS(a)]]C_{ro}$, where $C_{ro}$ is a predetermined constant; and wherein the step of generating said magnetic field gradient pulses of said second repetition sequence comprises applying said third waveform to said first means, said third waveform being of a form $[G(t)[COS(b)+SIN(b)]+A[(COS(b)--SIN(b)]]C_{ss}$; and applying said fourth waveform to said second means, said fourth waveform being of a form $[G(t)[SIN(b)-COS(b)]+A[SIN(b)+COS(b)]]C_{ro}$.

4. A method for conducting an examination of an object along two different selected planes using nuclear magnetic resonance techniques, said method comprising the steps of:

(a) positioning an object in an NMR imaging apparatus which includes means for generating a magnetic field, means for exciting selected nuclei to generate NMR signals and for reading of such NMR signals to provide a collection of NMR signals from selected regions of an object placed in said NMR imaging apparatus, means for applying gradient magnetic fields, means for obtaining NMR imaging data from said collection of NMR signals and means for producing an image from said NMR imaging data;

(b) operating said NMR imaging apparatus to obtain an NMR scout image for a portion of said object of said examination;

(c) while said object remains positioned in said NMR imaging apparatus, using said scout image to select a first plane and a second plane of said object for which NMR image data is to be obtained, said first plane and said second plane each being transverse to said scout plane, and said first plane having a first orientation relative to said scout plane and said second plane having a second orientation relative to said scout plane, said first orientation being different from said second orientation;

(d) conducting a plurality of NMR sampling operations to obtain NMR imaging data from said first selected plane of said object, said step of conducting said sampling operations for said first plane being commenced at a first time during the course of a single scan and being continued substantially throughout said single scan so as to obtain NMR imaging data for said first-selected plane of said object;

(e) conducting a plurality of NMR sampling operations to obtain NMR imaging data from said second selected plane of said object which is different from said first selected plane, said step of conducting said sampling operations for said second selected plane being commenced at a second time during the course of said single scan which is later than said first time, but prior to completion of said step of conducting said sampling operations for said first selected plane, and said step of conducting said NMR sampling operations for said second selected plane being continued substantially throughout said single scan to obtain NMR imaging data for said second selected plane;

each of said plurality of NMR sampling operations including an NMR excitation operation and an NMR reading operation, said NMR excitation operations for each of said selected planes being carried out in a manner so as to excite selected nuclei in said each of said selected planes, and said NMR reading operations for each of said selected planes being carried out in a manner to encode spatial information into said obtained NMR imaging data, each of said NMR excitation and NMR reading operations being performed at a different time during the course of said single scan than each other of said excitation and reading operations.

5. The method of claim 4, wherein step (d) comprises applying a first and a second waveform, corresponding to said first orientation of said first plane, to said means for applying gradient magnetic fields, to produce a first predetermined slice selector magnetic field gradient having a direction orthogonal to said first plane; and wherein step (e) comprises applying a third and a fourth waveform, corresponding to said second orientation of said second plane, to said means for applying gradient magnetic fields, to produce a second predetermined slice selector magnetic field gradient having a direction orthogonal to said second plane.

6. The method of claim 5, wherein said means for applying gradient magnetic fields comprises first means for generating a first magnetic field gradient having a first direction, and second means for generating a second magnetic field gradient having a direction orthogonal to said first direction, a direction of said first predetermined slice selector gradient being said first direction rotated by a first angle a, and a direction of said second predetermined slice selector gradient being said first direction rotated by a second angle b;
  wherein the step of applying said first and second waveforms comprises applying said first waveform to said first means, said first waveform being of a form $[G(t)[COS(a)+SIN(a)]+A[(COS(a)-SIN(a))]]C_{ss}$, where G(t) is a predetermined waveform, and A and $C_{ss}$ are predetermined constants;
  and applying said second waveform to said second means, said second waveform being of a form $[G(t)[SIN(a)-COS(a)]+A[(SIN(a)+COS(a))]]C_{ro}$, where $C_{ro}$ is a predetermined constant; and wherein
  the step of applying said third and said fourth waveforms comprises applying said third waveform to said first means, said third waveform being of a form $[G(t)[COS(b)+SIN(b)]+A[(COS(b)-SIN(b))]]C_{ss}$, and applying said fourth waveform to said second means, said fourth waveform being of a form $[G(t)[SIN(b)-COS(b)]+A[(SIN(b)+COS(b))]]C_{ro}$.

7. An apparatus for obtaining, in a course of a single scan, NMR image data for a plurality of selected planes, in an object, dispose at different angles relative to a predetermined direction, comprising:
  means for providing generic gradient waveforms; and
  means, coupled to said providing means, for generating gradient waveforms in said single scan that produce slice selector magnetic field gradients having, respectively, directions which are orthogonal to, respectively, said plurality of selected planes.

8. The apparatus of claim 7, wherein said generating means comprises:
  means, coupled to said providing means, for providing multiplier and offset parameters corresponding to said different angles of said selected planes; and
  means, coupled to generic gradient waveform providing means and to said multiplier and offset parameter providing means, for combining at least one of said generic gradient waveforms with said multiplier and offset parameters to produce said gradient waveforms.

9. The apparatus of claim 8, wherein said multiplier and offset parameter providing means includes means for providing multiplier parameters $[COS(a)+SIN(a)]C_{ss}$ and $[SIN(a)-COS(a)]C_{ro}$ for values of "a" corresponding to said different angles, where $C_{ro}$ and $C_{ss}$ are each predetermined constants, and for providing offset parameters $A[(COS(a)-SIN(a))]C_{ss}$ and $A[(SIN(a)+COS(a))]C_{ro}$ for values of "a" corresponding to said different angles, where A is a predetermined constant;
  wherein said generic gradient waveform providing means includes means for providing a generic gradient waveform G(t); and wherein
  said combining means includes means for generating waveforms having a form $[G(t)[COS(a)+SIN(a)]A[(COS(a)-SIN(a))]]C_{ss}$ and $[G(t)[SIN(a)-COS(a)]+A[(SIN(a)+COS(a))]]C_{ro}$ for values of "a" corresponding to said different angles.

10. An apparatus adapted to be coupled to a generator providing a generic gradient waveform G(t), for obtaining, in a course of a single scan, NMR image data for a plurality of selected planes, in an object, disposed at different angles relative to a predetermined direction comprising:
  slice pointer means for providing signals representing, respectively, said plurality of selected planes; and
  means coupled to said slice pointer means, for generating gradient waveforms in said single scan that produce slice selector magnetic field gradients having, respectively, directions which are orthogonal to, respectively, said plurality of selected planes, wherein said generating means comprises:
  means, coupled to said slice pointer means, and adapted to be coupled to said generator, for providing multiplier and offset parameters corresponding to said different angles of said selected planes; and
  means, coupled to said multiplier and offset parameter providing means, and adapted to be coupled to said generator, for combining said waveform G(t) with said multiplier and offset parameters to produce said gradient waveforms.

11. The apparatus of claim 10 wherein said multiplier and offset parameter providing means includes means for providing multiplier parameters $[COS(a)+SIN(a)]C_{ss}$ and $[SIN(a)-COS(a)]C_{ro}$ for values of "a" corresponding to said different angles, where $C_{ro}$ and $C_{ss}$ are predetermined constants, and for providing offset parameters $A[COS(a)-SIN(a)]C_{ss}$ and $A[SIN(a)+COS(a)]C_{ro}$ for values of "a" corresponding to said different angles, where A is a predetermined constant; and wherein
  said combining means includes means for generating waveforms having a form $[G(t)[COS(a)+SIN(a)]+A[COS(a)-SIN(a)]]C_{ss}$ and a form $[G(t)[SIN(a)-COS(a)]+A[SIN(a)+COS(a)]]C_{ro}$, for values of "a" corresponding to said different angles.

12. Apparatus for obtaining NMR image data from a plurality of selected planes in an object comprising:
  (a) means for applying magnetic fields to the object;
  (b) means for applying radio frequency excitation pulses to the object;
  (c) means for actuating and controlling said magnetic field applying means and said radio frequency applying means to:
    (1) apply a first sequence including a first slice selector magnetic field gradient in a first direction concomitantly with a first RF excitation pulse at a first frequency to thereby excite nucleii only in a first plane perpendicular to said first direction, whereby a first NMR signal will be emitted only by nucleii in said first plane, said first sequence further including at least one encoding magnetic field gradient operative to encode spatial information into said first NMR signal;
    (2) apply a second sequence including a second slice selector magnetic field gradient in a second direction different from said first direction concomitantly with a second RF excitation pulse at a second frequency different from said first frequency to thereby excite nucleii only in a second plane perpendicular to said second direction whereby a second NMR signal will be emitted only by nucleii in said second plane, said second sequence further including at least one encoding magnetic field gradient operative to encode spatial information into said second NMR signal; and
    (3) a repeat said first and second sequences a plurality of times during the course of a single scan so as to excite nucleii in said first and second planes alternatively and produce said first and second NMR signals alternately while varying said at least one encoding gradient in each said sequence on each repetition; and (d) means for receiving said first and second NMR signals and recovering NMR image data therefrom.

* * * * *

UNITED STATES PATENT AND TRADEMARK OFFICE
CERTIFICATE OF CORRECTION

PATENT NO. : 4,871,966

DATED : October 3, 1989

INVENTOR(S) : Stanton D. Smith, et al.

It is certified that error appears in the above-identified patent and that said Letters Patent is hereby corrected as shown below:

On the title page;

In the identification of the inventors, insert on the last line --New York--.

Signed and Sealed this

Fourth Day of December, 1990

Attest:

HARRY F. MANBECK, JR.

*Attesting Officer*     *Commissioner of Patents and Trademarks*